US010297707B1

(12) United States Patent
Globus et al.

(10) Patent No.: US 10,297,707 B1
(45) Date of Patent: May 21, 2019

(54) THIN FILM PHOTOVOLTAIC CELL SYSTEM AND METHOD OF MANUFACTURE

(71) Applicants: Tatiana Globus, Charlottesville, VA (US); Pineas Paxton Marshall, Charlottesville, VA (US); Boris Gelmont, Charlottesville, VA (US); Lloyd Harriott, Charlottesville, VA (US); Naser Alijabbari, Charlottesville, VA (US); John C Bean, Charlottesville, VA (US); Joe C Campbell, Charlottesville, VA (US)

(72) Inventors: Tatiana Globus, Charlottesville, VA (US); Pineas Paxton Marshall, Charlottesville, VA (US); Boris Gelmont, Charlottesville, VA (US); Lloyd Harriott, Charlottesville, VA (US); Naser Alijabbari, Charlottesville, VA (US); John C Bean, Charlottesville, VA (US); Joe C Campbell, Charlottesville, VA (US)

( * ) Notice: Subject to any disclaimer, the term of this patent is extended or adjusted under 35 U.S.C. 154(b) by 778 days.

(21) Appl. No.: 14/042,434

(22) Filed: Sep. 30, 2013

Related U.S. Application Data

(63) Continuation of application No. 12/711,165, filed on Feb. 23, 2010, now abandoned.
(Continued)

(51) Int. Cl.
*H01L 31/18* (2006.01)
*H01L 31/072* (2012.01)

(52) U.S. Cl.
CPC ............ *H01L 31/18* (2013.01); *H01L 31/072* (2013.01)

(58) Field of Classification Search
USPC .................................................. 250/216–239
See application file for complete search history.

(56) References Cited

U.S. PATENT DOCUMENTS

2003/0041894 A1* 3/2003 Sverdrup, Jr. ...... C23C 14/3435
136/251
2005/0224707 A1* 10/2005 Guedj et al. .................. 250/239
(Continued)

OTHER PUBLICATIONS

Pintillie et al., Field Effect Assisted Photoconductivity in PbS Films Deposited on Silicon Dioxide, Journal of Applied Physics, vol. 91, No. 9, pp. 5782-5786 (2002).*
(Continued)

*Primary Examiner* — Jayne L Mershon
(74) *Attorney, Agent, or Firm* — Dale Jensen, PLC; Dale Jensen

(57) ABSTRACT

A photovoltaic structure for absorption from the solar spectrum, includes a light transmitting substrate layer, a transparent electrode layer on the substrate layer, a direct band-gap, wide band-gap, nanocrystalline or microcrystalline, think film semiconducting first layer on the transparent electrode layer, a second think film layer comprising a narrow band-gap semiconductor on the first layer a second electrode layer on the second think film layer, and a protective layer on the second electrode layer. The structure has a hetero-structure at the boundary between the wide-band-gap layer and the second thin film layer. The second layer can be chalcogenide salt having an average thickness of 0.4 to 1.2 µm, and preferably an average thickness of 0.5 to 0.6 µm. The chalcogenide salt layer is a lead chalcogenide, such as a nanocrystaline lead sulfide, nanocrystalline lead selenide, or a nanocrystalline lead telluride.

20 Claims, 6 Drawing Sheets

Related U.S. Application Data

(60) Provisional application No. 61/154,468, filed on Feb. 23, 2009.

(56) References Cited

U.S. PATENT DOCUMENTS

| | | | | |
|---|---|---|---|---|
| 2005/0236032 A1* | 10/2005 | Aoki | .......... | H01L 31/0749 136/252 |
| 2007/0098996 A1* | 5/2007 | Frey | .......... | C23C 18/1603 428/422 |
| 2008/0230120 A1* | 9/2008 | Reddy | .......... | 136/260 |
| 2009/0014055 A1* | 1/2009 | Beck | .......... | H01L 31/02168 136/246 |
| 2009/0283665 A1* | 11/2009 | Waldman | .......... | 250/216 |

OTHER PUBLICATIONS

Stancu et al., A Comparative Study of Microcrystalline and Nanocrystalline Lead Sulfide Based PbS/SiO2/Si Heterostructures, Romanian Journal of Information Science and Technology, vol. 10, No. 1, pp. 53-66 (2007).*

Oriaku et al., Analysis of Thin Chalcogenide PbS Films Prepared from Chemical Bath, The Pacific Journal of Science and Technology, vol. 9, No. 2, pp. 461-466 (2008).*

Pentia et al., Chemically Prepared Nanocrystalline PbS Thin Films, Journal of Optoelctronics and Advanced Materials, vol. 3 No. 2, pp. 525-529 (p. list of 525-530 in article is misprint; all 17 references are listed on p. 529) (2001).*

Zeghbroeck, Principles of Semiconductor Devices, Carrier Transport (on-line text books), pp. 1-13 (2011).*

* cited by examiner

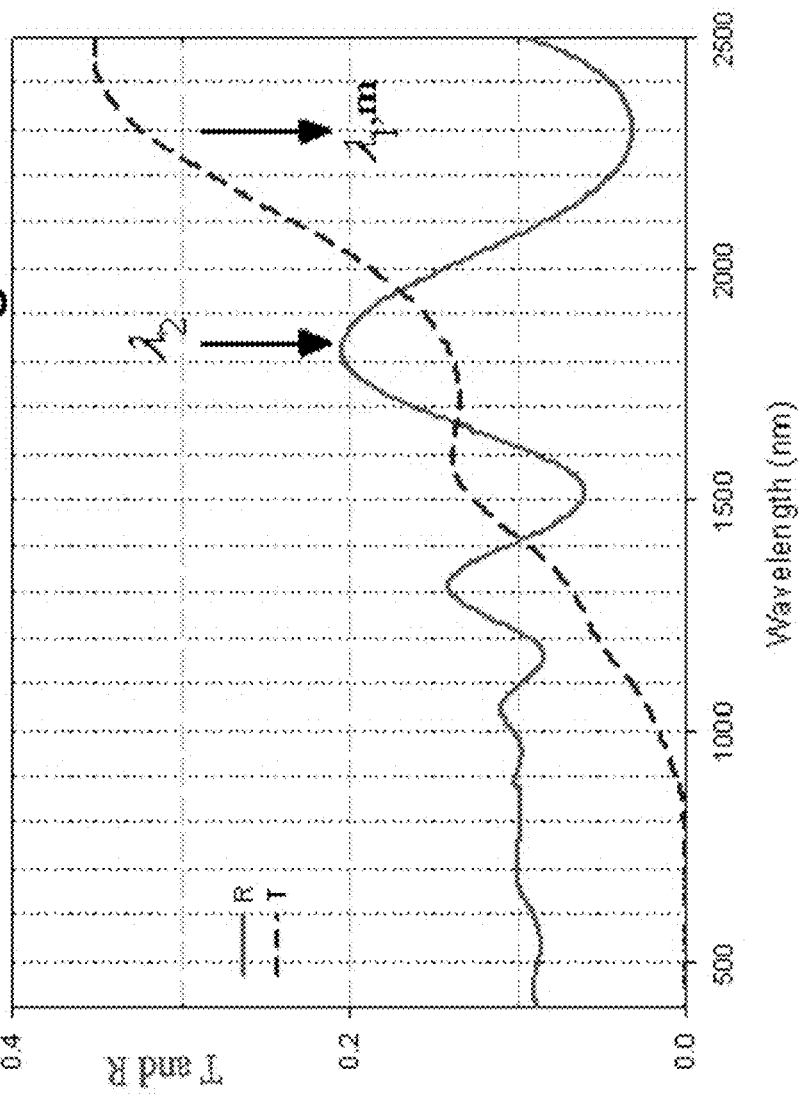

THIN FILM PHOTOVOLTAIC CELL SYSTEM AND METHOD OF MANUFACTURE

CROSS-REFERENCE TO RELATED PATENT APPLICATION

This patent application claims the benefit of application Ser. No. 12/711,165 filed Feb. 23, 2010 which claims benefit of provisional patent application 61/154,468, filed Feb. 23, 2009, and having the title "Inexpensive Thin Film Photovoltaic Cell System and Related Method", the disclosures of which are incorporated by reference, as though recited in full.

GOVERNMENT INTEREST STATEMENT

None

FIELD OF THE INVENTION

The present invention relates to photovoltaic technology and more particularly to low cost thin film photovoltaic cells, their compositions, and their method of manufacture.

BACKGROUND OF THE INVENTION

First generation photovoltaics, single layer p-n junction diodes (silicon wafer-based solar cells) are the dominant technology in the commercial production of solar cells, accounting for more than 86% of the solar cell market. Between 2000 and 2004, the increase in worldwide solar energy capacity was an annualized 60%. Although 2005 was expected to see large growth again, shortages of refined silicon started hampering production worldwide in late 2004.

Multi-junction thin film technology for the second generation photovoltaics was aimed to fit the solar spectrum better and reduce the cost (a-silicon, poly-crystalline silicon, microcrystalline silicon, CdTe, copper indium selenide/sulfide CIGS). However neither of these goals has been achieved.

All solar cells of these two generations are based on the principle that the quantum efficiency (QE) equals one for photons with the energy above the bandgap (hv>Eg). Very recently, it was demonstrated that a photon with the energy hv>3Eg can create more than one electron-hole pair (exciton) via impact ionization—carrier multiplication (CM). Up to 7 pairs were demonstrated being generated in the time frame of ~10-12 fs in ultra-small nanocrystalline (~10 nm) lead salt PbS and PbSe materials. With CM quantum efficiency increases roughly linearly up to 700% with pump photon energy above the activation threshold [3] with theoretical limits for energy efficiency of >60% without CM. However, practical realization of these principles requires very fast separation of electrons and holes to prevent their recombination.

SUMMARY OF INVENTION

An aspect of various embodiments of the present invention system and method for photovoltaic (PV) fabrication comprises, but not limited thereto, the following: 1) a broad range of absorption from the solar spectrum due to a direct band-gap, narrow band-gap, nanocrystalline, thin film (~0.5 μm) semiconducting layer, highly absorbing all photons with the energy above a forbidden gap, Eg; 2) carrier multiplication for carriers generated in a narrowband semiconductor with photons energy above 3 Eg; 3) fast carriers transfer and transport due to the small size of nano-particles and close distance to electrodes; and 4) effective separation of carriers with opposite charges due to a built-in electric field in a hetero-structure at the boundary between a narrow-band layer and a second thin film layer made of a wide band-gap semiconductor.

The photovoltaic technology of the present invention, of low cost thin film solar cells, is based on exploitation of advances from using nanomaterials and nanostructures for the significant enhancement of solar conversion efficiencies. An aspect of various embodiments of the present invention system for high efficiency solar cell fabrication comprises, but is not limited to, two active layers: a nano-crystalline layer of a narrow-band gap, direct band-gap semiconductor material (for example, lead chalcogenide salts—PbSe, PbS) and a wide band gap semiconductor material (for example, micro-crystalline silicon (μ-Si), nano-crystalline Si (nano-Si), or cadmium selenide (CdSe) nano, micro-crystalline layer), using an inexpensive thin film technology for all layers. Most sunlight will be absorbed in the narrow band semi-conductor, which can be a p-type layer. The second layer is used to create a hetero-junction for effective transfer of excitons and carrier separation.

In accordance with an embodiment of the invention, a photovoltaic structure is provided for absorption from the solar spectrum. The structure comprises a light transmitting substrate layer, a transparent electrode layer on said substrate layer, a direct band-gap, wide band-gap, nanocrystalline, thin film semiconducting first layer on said transparent electrode layer, and has a hetero-structure at the boundary between said wide-band layer and a second thin film layer. The second thin film layer comprises a narrow band-gap semiconductor. A second electrode layer is provided on the second thin film layer, and a protective layer is provided on the second electrode layer.

In accordance with a further embodiment of the invention, the transparent electrode is characterized by having a transmittance above 80% and sheet resistance less than 70 ohms/sq.

In accordance with a further embodiment of the invention, the second layer is a chalcogenide salt having an average thickness of from 0.4 to 1.2 μm.

In accordance with another embodiment of the invention, the photovoltaic structure chalcogenide salt layer has an average thickness of 0.5 to 1 μm, and most advantageously, an average thickness of from 0.5 to 0.6 to μm.

In accordance with another embodiment of the invention, the photovoltaic structure chalcogenide salt layer is a lead chalcogenide, and particularly, nano-crystalline lead sulfide, nanocrystalline lead selenide, or a nanocrystalline lead telluride.

In accordance with still another embodiment of the invention, the photovoltaic structure chalcogenide is a member of the group comprising sulfides, selenides, and tellurides.

In accordance with a further embodiment of the invention, the photovoltaic structure has a layer of a nano-silicon.

In accordance with a further embodiment of the invention, the photovoltaic structure has a layer of a micro-crystalline Si.

In accordance with a still further embodiment of the invention, the photovoltaic structure has a thickness of the including electrodes and protecting layers but without the substrate, of less than 5 μm.

In accordance with an additional embodiment of the invention, the photovoltaic structure has a first layer selected from the group comprising micro-crystalline silicon (μ-Si), nano-crystalline Si (nano-Si), or nano, micro-crystalline cadmium selenide (CdSe), and a second layer that is a nano-crystalline layer of a lead chalcogenide salts selected from the group comprising PbSe, PbS, PbTe, or InAs.

In accordance with a further embodiment of the invention, the photovoltaic structure has ohmic contacts with each of two electrodes.

In accordance with a further embodiment of the invention, the photovoltaic structure has a first electrode that is a transparent indium tin oxide layer and said second electrode that is Pt or Au.

In accordance with a still further embodiment of the invention, the photovoltaic structure has a protection layer that is a chalcogenide glass material.

In accordance with a still further embodiment of the invention, the photovoltaic structure has a protection layer that is a thin film of $Al_2O_3$, $As_2S_3$, CdTe, $MgF_2$, $SiO_2$, SiO, polystyrene, ethylcellulose, nitrocellulose, polyvinylchloride, AB S, polymethylmethacrylate, polybutadiene, or polyvinylalcohol and has a transmission spectra in the wavelength of less than 3 µm.

In accordance with a still further embodiment of the invention, the photovoltaic structure has a second electrode that is characterized by having a work function equal to, or greater than the work function of said second thin film layer, and wherein the second thin film layer is PbS.

In accordance with a still further embodiment of the invention, the photovoltaic structure has an electrode that is formed from a material which is a member of the group comprising Silver, Copper, Molybdenum, Rhemium, Selenium, Tantalum, Beryllium, Rhodium, Si, Cobalt, Iron, Palladium, Ruthenium, Tellurium. Au, Carbon, Chromium, Iridium, Platinum, Antimony, Tungsten, and Nickel.

In accordance with a still further embodiment of the invention, the photovoltaic structure has an electrode that is formed from a material which is a member of the group comprising Copper, Si, Cobalt, Iron, Carbon, and Nickel.

In accordance with a still further embodiment of the invention, the photovoltaic structure has an electrode that is formed from Platinum or Au.

In accordance with an additional embodiment of the invention, the photovoltaic structure has a silicon layer from 0.5 to 2 µm in average thickness.

In accordance with another embodiment of the invention, a photovoltaic structure is provided that has a light transmitting substrate layer, a transparent electrode layer, a, silicon layer, a direct band gap semiconductor layer, a metal electrode layer, and a protective layer, and the method of manufacture includes the step of depositing a chalcogenide thin film from a chemical bath.

In accordance with another embodiment of the invention, a photovoltaic structure is provided that has a light transmitting substrate layer, a transparent electrode layer, a silicon layer, a direct band gap semiconductor layer, a metal electrode layer, and a protective layer, and the method of manufacture includes the step of depositing a chalcogenide thin film from a chemical bath, and wherein the chalcogenide thin film is PbS having a nanocrystalline structure with a crystal size of less than 1 µm.

In accordance with still another embodiment of the invention, a photovoltaic structure is provided that has a light transmitting substrate layer, a transparent electrode layer, a direct band-gap, narrow band-gap, nanocrystalline, thin film semiconducting first layer on said transparent electrode layer, a direct band gap semiconductor second layer, a hetero-junction between said first layer and said second layer, a metal electrode layer, and a protective layer, and the method of manufacture includes the step of depositing a PbS layer the first layer, washing the film in deionized water to remove loose particles, drying said washed film, depositing a second PbS layer on said silicon layer, and depositing a third PbS layer on said second PbS layer. Additionally, the third layer has cubic crystals having an average width of about 200 nm.

Some exemplary novel aspects associated with various embodiments of the present invention provides, but is not limited to, the following:

1. Active light absorbing thin film layer (0.5 µm)—direct band-gap, narrow band gap
2. Nano crystalline, p-type semiconductor—highly absorbing material (Eg~0.3 eV)
3. Carrier multiplication for hv>3 Eg
4. Additional absorption in a wide band-gap, n-type, nano (or micro-) crystalline, thin film semiconductor layer (for example n-doped microcrystalline-Si film or polycrystalline film of CdSe) at photon energy above the band gap of these materials (hv>1.2-1.7 eV).
5. Effective carrier separation in a single hetero-junction between two layers.
6. Small distance for transport of electrons and holes to electrodes
7. Small amount of material required
8. Good ohmic contacts with electrodes in both layers with an appropriate choice of electrode materials (for example, Au for p-type layer, and a transparent top electrode of ITO for a Si-layer).
9. Simplicity of all manufacturing processes based on thin film technology, which provides a combination of inexpensive technology of photovoltaic cells with high energy efficiency of proposed photovoltaic device.

SUMMARY OF THE FIGURES, DIAGRAMS AND DRAWINGS

FIG. 5. T & R of 547 nm PbS thin film.

Figure 6:
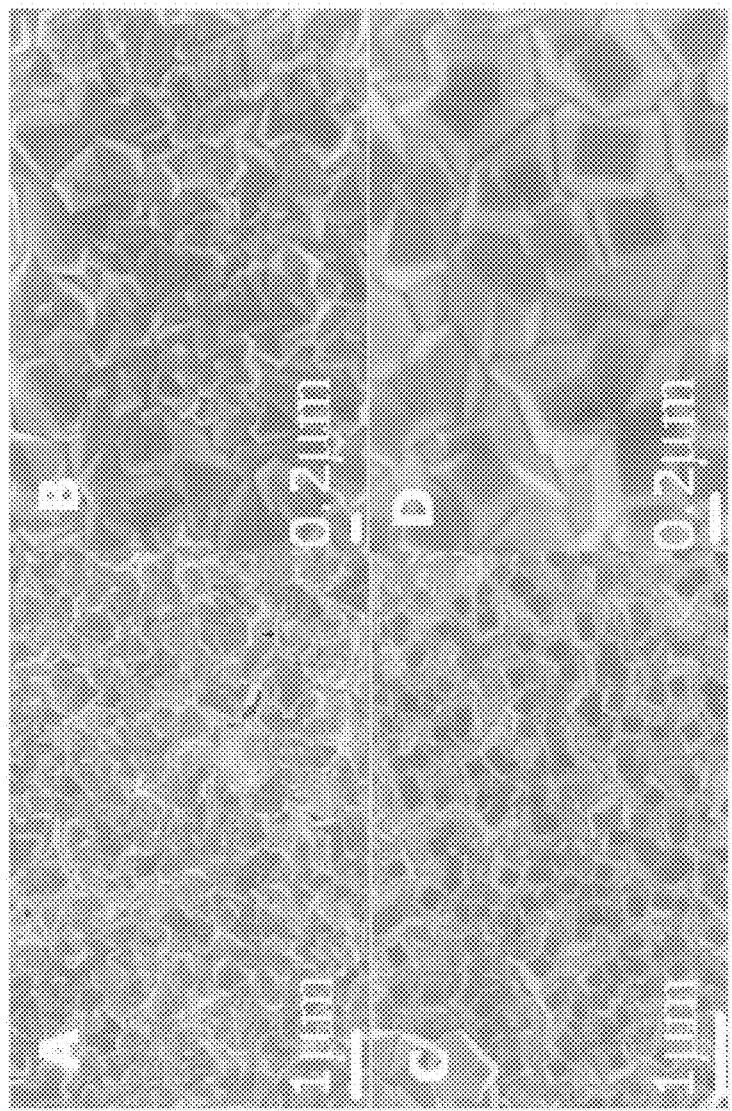

FIG. 6. Surface Emitting Microscopes (SEMs) of first (A & B) and third (C & D) deposited layer from sample 15.

DETAILED DESCRIPTION OF THE INVENTION

Thin films of micro- and nano-crystalline lead salts (i.e, PbS and PbSe) are attractive semiconductor materials for large-scale applications, because of availability and low cost of lead, sulfide and selenide compounds.

The interest in lead salt thin films is primarily due to their potential use as infrared detectors. These films are highly sensitive at room temperatures and can be used for detection of near infrared radiation ($\lambda$=0.7-4 µm). More recently lead selenide thin films were used to develop highly efficient light emitting diodes operating at room temperature. Lead-salt semiconductors are very favorable materials for mid-infrared lasers because of their unique energy bands structure and two orders lower Auger recombination rate compared to narrow gap III-V or 11-VI semiconductors.

Even more recently lead chalcogenides attracted new attention as promising materials for solar cells. It was demonstrated that effect of carrier multiplication (CM) becomes extremely efficient in ultra-small semiconductor lead-salt PbS and PbSe nanocrystals.

CM quantum efficiency increases roughly linearly, up-to 700%, with pump-photon energy above the activation threshold. However practical application of CM is restricted because of fast Auger recombination processes. For useful realization of the CM mechanism, charge transport and separation has to occur in a time scale less than pico second that is faster than Auger recombination.

Polycrystalline films of lead sulfide and lead selenide possess a potentially very favorable set of specific features for development of advanced solar cells. The process of radiation absorption is characterized by direct optical transitions. As a result, a thickness of about 0.5-1 µm is enough for an active layer to absorb the essential part of the radiation. An internal efficiency of interband radiative recombination in these films as high as 60% has been achieved. Photosensitive structures based on these materials can be formed by vacuum deposition of thin films on glass substrate or on oxidized silicon wafers. Films are then annealed in air. This process creates conditions for very high purity material inside crystallites, and passivates the surface with an intrinsic oxide, providing a rate of surface recombination less than 1 cm/s.

We have intensively studied the band structure of these materials near the fundamental gap as well as their optical characteristics. It has now been found that planar heterojunction with a Si layer will create good conditions for charge separation with the average path length less than 0.5 µm. Thus, the possibility of lead chalcogenide layers being coupled with Si-technology creates the basis for a simple, effective and inexpensive solar cell technology.

Lead chalcogenide detector materials can be chemically deposited as polycrystalline thin films on an insulating substrate. The technological processes for manufacturing photo detectors and light emitting diodes (LED) based on lead chalcogenide thin films and operating at room temperature are well developed and these products are available on the market.

The present design for a photovoltaic cell provides, among other benefits, the following:

(1) utilization of the full solar spectrum for energy conversion, (2) generation of multi-electrons with single incident light photon for higher current generation, and (3) manufacture of solar cells at relatively lower costs due to simplified thin film technologies.

A heterojunction is the interface that occurs between two layers or regions of dissimilar semiconductors. These semiconducting materials have unequal band gaps as opposed to a homojunction. By way of contrast, a homojunction is a semiconductor interface that occurs between layers of similar semiconductor material. These materials have equal band gaps but typically have different doping. In most practical cases a homojunction occurs at the interface between an n-type (donor doped) and p-type (acceptor doped) semiconductor, this is called a pn junction. The same semiconductor (same band gap) is found on both sides of the junction, in contrast to a heterojunction.

Although light emitters are photovoltaic devices as well as solar cells, the technology developed for heterojunctions in LEDs is not directly applicable for solar cell manufacturing for two reasons 1) because of very different geometry requirements, and 2) because carrier transport in LED and in solar cell devices occurs in opposite directions. This second reason reflects the fact that the two devices are not identical and operate in an inverse manner. In the LED, the external voltage applied to a Schottky barrier in direct polarity, reduces the barrier height, generates carriers flow from electrodes, enlarges the carrier population within the active layer and stimulates light emission due to radiative recombination. In the solar cell, the radiation generating process that is inverse to emission creates two types of carriers within the active layer. These carriers separate according to the direction of the internal built-in electric field reducing the barrier height allowing them to move to the electrodes. Thus, the carriers move through the barriers in opposite direction. Nevertheless, both devices require good quality barriers and electrodes. In both devices, Auger recombination and other recombination processes (for example, surface recombination) produce negative effects.

Figure 1:
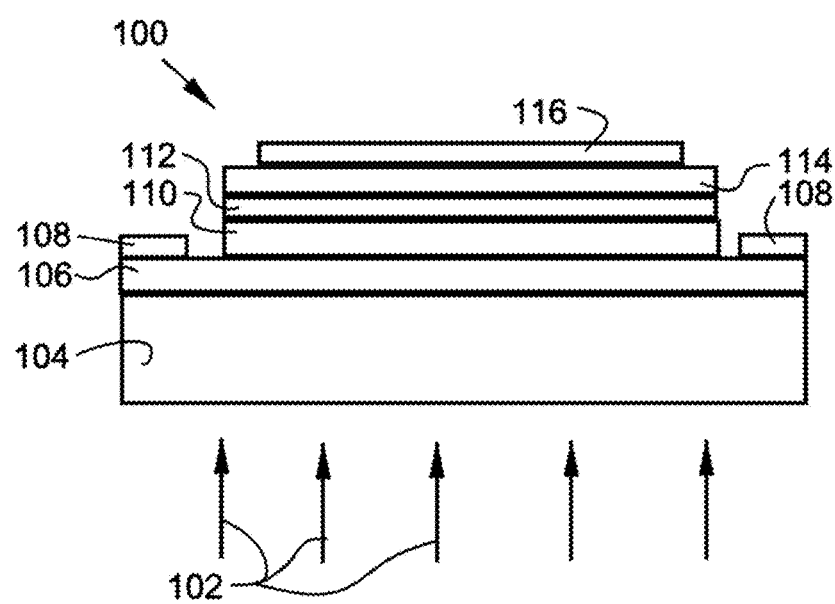
FIG. 1 is a schematic illustration of an embodiment of a photovoltaic structure of the present invention.

An embodiment of the invention is shown schematically in FIG. 1. The photovoltaic structure, indicated generally as 100, includes a substrate layer 104, an indium-tin oxide layer 106, electrodes 108, a micro-silicon layer 110, a lead chalcogenide layer 112, a metal layer 114, and a protective layer 116.

The two metal electrodes 108 and 114 are an important part of the device in that they serve as contacts to an external circuit. Since the contact has to be ohmic the metal used for the electrode is important. Gold is a good material for ohmic contact to p-type lead chalcogenide, however it is expensive. Other metals which can be used include nickel, and gold doped with Indium. The criteria required for ohmic contact are: 1) the electrode material should have a smaller work function than the work function of the photoconductor if the latter is n-type (not the present case), or a larger work function if the photoconductor is p-type, and 2) the electrode material should be an n-type impurity, if incorporated in the photoconductor, if the latter is n-type, or p-type impurity if the photoconductor is p-type, the expectation being that some diffusion in the neighborhood of the electrodes will occur to provide a conducting region which can act as a reservoir for charge carriers.

The work function of PbS is ~4.53 eV (with a doping of $10^{17}$-$10^{18}$ 1/cm$^3$). Therefore the following fit the first criteria: Silver (work function 4.52-4.74 eV), Copper (4.53-5.10 eV), Molybdenum (4.36-4.95 eV), Rhemium (4.72 eV), Selenium (5.9 eV), Tantalum (4-4.8 eV), Beryllium (4.98 eV), Rhodium (4.98 eV), Si (4.60-4.85 eV), Cobalt (5 eV), Iron (4.67-4.81 eV), Palladium (5.22-5.6 eV), Ruthenium (4.71 eV), Tellurium (4.95 eV), Au (5.1-5.47 eV), Carbon (~5 eV), Chromium (4.5 eV), Iridium (5-5.67 eV), Platinum (5.12-5.93 eV), Antimony (4.55-4.7 eV), Tungsten (4.32-5.22 eV), Nickel (5.04-5.35 eV). But these materials might not be a p-type impurity in the p-type PbS. The cost effective contacts are Copper (4.53-5.10 eV), Si (4.60-4.85 eV), Cobalt (5 eV), Iron (4.67-4.81 eV), Carbon (~5 eV), Nickel (5.04-5.35 eV). Primarily, Platinum (5.12-5.93 eV) and Au (5.1-5.47 eV) are used as a contact for PbS.

Protective layers are provided because thin film devices have to be protected from environmental influences, which can significantly modify the property of a layer of the photovoltaic device 100. The substrate 104, for example glass, also serves as a protecting component. The second, or top, protection layer 116 can be made from a polymer material or from a chalcogenide glass material. These two materials are not expensive and the technology is rather simple. The materials used for the protection layers have to be extremely reliable to enable the device 100 to have a long life.

Light 102, is incident from the glass substrate side 104 (or substrate from other transparent material, for example plastic), through a transparent first electrode 106, (for example, as indium tin oxide), passes through a Si-layer 110, of 0.5-2 μm thickness (or other wide band gap semiconductor), where high energy photons (>2 eV) will be partially absorbed, and then reaches a highly absorbing layer 112, of lead chalcogenide salts or other high absorption coefficient material. Most of the light starting from the IR with the photon energy much below 1 eV will be absorbed in the layer 112 of direct band gap semiconductor having small Eg and high absorption coefficient (in this case one of lead salt materials). The portion of photons with energy between Eg and 3Eg will generate only one electron-hole pair per photon, but above 3 Eg, the mechanism of carrier generation changes. One photon in this high energy range can generate several electron-hole pairs probably via the mechanism of impact ionization (inverse Auger processes) and the number of generated excitons becomes a linear function of energy. The second metal electrode is 114 is deposited on the lead salt layer 112. The thickness of the entire structure including electrodes 114 and 106 and protecting layers 116 and 104, but without substrates is advantageously less than 5 μm. The two active layers 110 and 112 are separated by a heterojunction between the Si and lead chalcogenide layers.

Apart from two active layers 110 and 112, other important layers have to be incorporated into the entire cell structure including a transparent indium tin oxide (ITO) electrode 106, a second Ohmic electrode 114, (preferably Au or other metal) and Ohmic contacts 108. Chalcogenide glass, for example $As_2S_3$, $As_2Se_3$, and their alloys with iodine, can be used as a first protecting layer for the lead salt material, although other protection means which can be used include thin films of $Al_2O_3$, CdTe, $MgF_2$, $SiO_2$, SiO, polystyrene, ethylcellulose, nitrocellulose, polyvinylchloride, ABS, polymethylmethacrylate, polybutadiene, and polyvinylalcohol (based on the transmission spectra of these thin films in the wavelength of interest <3 μm.)

Nanocrystalline films of lead sulfide and selenide possess a potentially very favorable set of specific features for the development of advanced solar cells. The process of radiation absorption is characterized by direct optical transitions. As a result, the thickness of about 0.5-1 μm is enough for an active layer to absorb the essential part of the radiation of interest.

Figure 2:
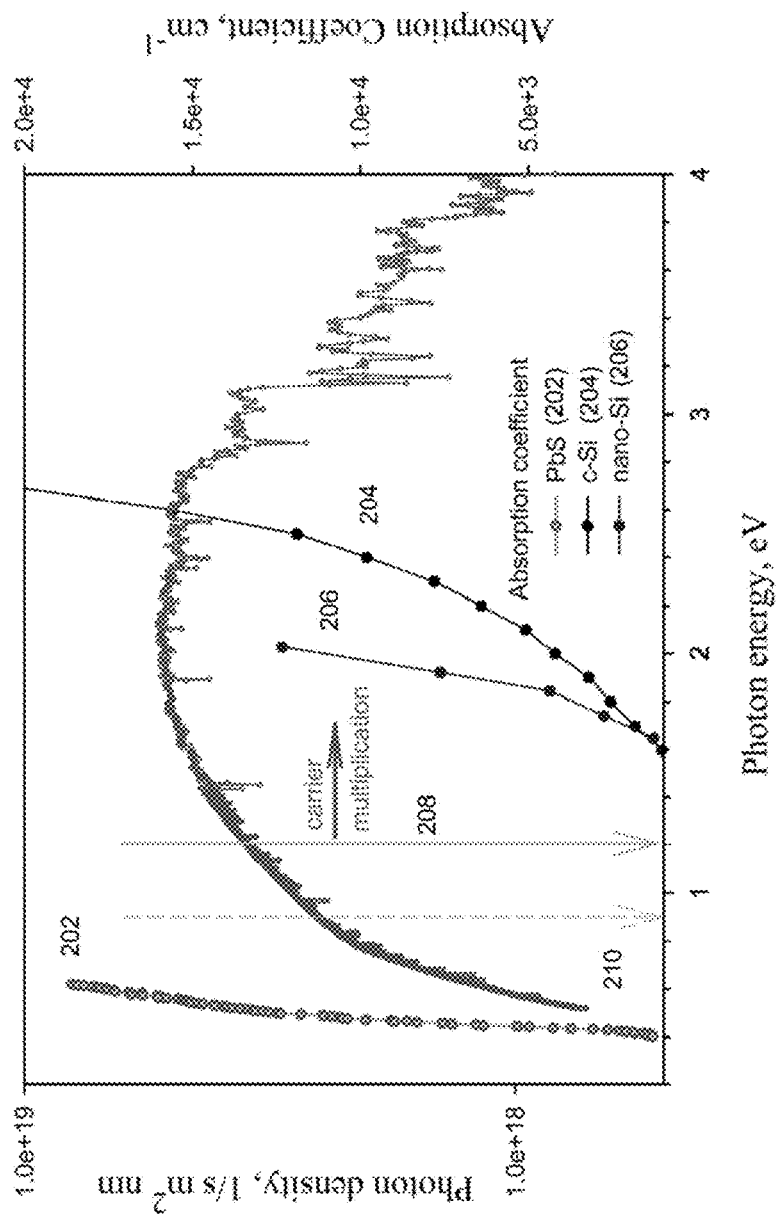
FIG. 2 is a graph of the absorption of photons from sun-light in the photovoltaic system of the present invention.

The Curve 210 (FIG. 2) shows the distribution of Photon density in the sun light as a function of photon energy. Although the maximum of photon density occurs for photon energy about 2 eV, there are still many photons with the energy below 2 eV. The number of such low energy photons can be calculated as an integral from the zero to this upper limit (the area under the curve below this limit). It is approximately of one half of the whole number of photons in the sun light. At the same time traditional materials like crystalline silicon (204) or nano- and amorphous—Si (206) can only absorb photons with the energy above ~1.1 eV. Besides, since c-Si is an indirect band semiconductor, its absorption coefficient is a slowly growing function of energy. The number of photons that can be absorbed by this material can be estimated by the area under the curve 210 above this limit. This number depends on the thickness of material layer, and to enlarge the number of photons that will be absorbed, the thickness of layer has to be increased. For example the thickness of active layers in solar cells from polycrystalline Si is ~100 microns. On the other side, lead salts are narrow direct band gap semiconductors. These materials start absorption of low energy photons with absorption coefficient a very fast growing function of energy such that for example above 0.6 eV it is greater than $2*10^4$ $cm^{-1}$.

Figure 3:
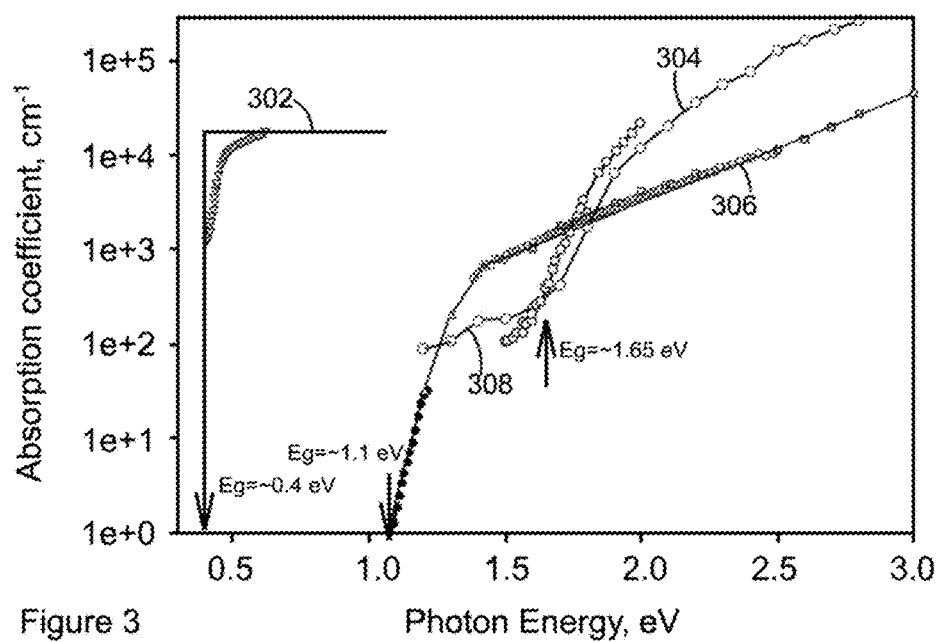
FIG. 3 is a graph of the absorption spectra of lead sulfide and silicon.

Absorption of radiation is determined by the absorption coefficient spectrum as a function of photon energy or wavelength of radiation. These spectra are quite different (FIG. 3) for direct and indirect band semiconductors, as shown in FIGS. 4A and 4B.

Figure 4A:
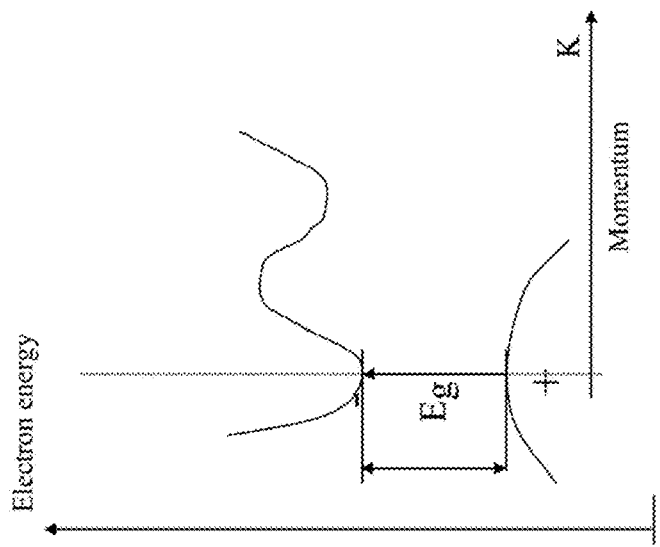
FIGS. 4A and 4B are graphs of the absorption coefficient spectrum for direct and indirect band semiconductors.
Figure 4B:
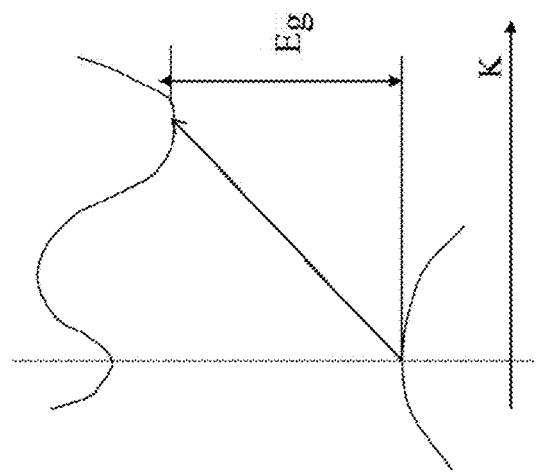

Lead chalcogenides are direct band gap semiconductors (FIG. 4A). This means that the conduction band minimum (conduction band is the upper curve representing electrons, which are denoted by the sign −) is directly above the valence band maximum (valence band is shown by the lower curve with the sign + representing holes) in the space of the momentum K. Absorption of radiation initiates transitions of electrons from the valence band (where they were bounded to atoms) into the conduction band (where they become free) leaving free holes in the valence band. In direct band gap semiconductor this process only requires transferring quantum of energy from radiation to electrons without changing momentum. In this case, as soon as the energy of a photon only slightly exceeds the energy gap Eg between the valence and conduction bands, absorption coefficient becomes extremely fast growing function of energy. In FIG. 3, the curve for PbS represents the exponential growth of absorption coefficient at the radiation energy above Eg, which is the minimum separation between the valence and conduction bands.

In the case of PbS, the absorption coefficient rapidly approaches the value of alpha=$2*10^4$ $cm^{-1}$, which means that at the distance of 1/alpha=$0.5*10^{-4}$ $cm^{-1}$=0.5 μm from the surface of material, the intensity of radiation will be reduced as e=2.7 times (Beer's law), and ~70% of radiation will be absorbed by materials. Less than 0.5 μm would result in losses of significant portion of radiation absorption without generation of charge carriers (electron-hole pairs). These estimates are very approximate since the Beer's law is only valid for the bulk material. In thin films the absorption is a more complicated function of thickness due to multiple reflections on two surfaces (interfaces) of a layer.

At the distance of 1 μm more than 90% of the radiation will be absorbed. A thickness of greater than 1 μm increases the complexity of depositing the layer, increases cost, increases the distance between a heterojunction and metal electrode for carrier separation, and increases recombination rate, thus reducing the efficiency.

Accordingly, a range in thickness of from 0.4 to 1.2 μm can be used, with a range from 0.5 to 1 μm being preferred, and a range from 0.5 to 0.6 μm being most preferred.

In the case of indirect band gap semiconductors, like crystalline Si, the situation is quite different (FIG. 4B). Transition of electron from the top of valence band to the bottom of conduction band requires not only a change of its energy but also of its momentum. It is difficult to satisfy both of these conditions simultaneously since the radiation photon does not have a momentum. The requirement of momentum conservation law in indirect band gap semiconductors reduces significantly the probability of a free carrier generation via absorption of radiation with energy close to Eg, as shown in FIG. 3, for crystalline c-Si, 306. The thickness of crystalline Si layer as high as 100 μm is required for sufficient absorption of solar radiation. In FIG. 3, the PbS direct band gap semiconductor is indicated as 302. Amorphous Si (a-Si) is represented by the reference numeral 304. The sub-gap tale adsorption of a-Si is indicated by reference numeral 308.

An internal efficiency for interband radiative recombination in these lead salt films as high as 60% has been achieved in the past. Photosensitive structures based on these materials can be formed by vacuum deposition of thin films on glass substrate or on oxidized silicon wafers. The thin films are then annealed in air. Annealing temperature as high as 550° C. can be required for PbSe, and much lower for PbS. This process creates conditions for very high purity material inside crystallites, and passivates the surface with an intrinsic oxide, providing a rate of the surface recombination less than 1 cm/s. Different versions of alternative methods of chemical bath deposition were used as well. The planar heterojunction with a Si layer creates good conditions for charge separation with a path length less than 0.5 μm.

The crucial function of heterojunction is to separate carriers with different signs, electrons and holes, generated by radiation to prevent their recombination before they reach external electrodes where they contribute to a voltage or a current. The thickness of a lead salt layer determines a distance between a metal electrode and a heterojunction that is the path length for separation. Thus, the coupling of lead chalcogenide layers with Si-technology creates the basis for a simple, effective and inexpensive solar cell technology.

Absorption Spectrum of Materials and Thickness Required

Lead salts—direct band gap semiconductors: the minimum of the conduction band lies directly above the maximum of the valence band in momentum space.

c-Si-Indirect band gap: a direct transition across the band gap does not conserve momentum and is forbidden.

Photo-Electronic Properties of PbS Thin Films Deposited by Chemical Bath Deposition Methods of Depositing There are several methods of depositing PbS films, however chemical bath deposition (CBD) is most used technique due to its low cost and the quality of the obtained films. Nevertheless, the characteristics of chemically deposited PbS thin films depend strongly on the composition of deposition bath and the nature of the substrate. The structural properties of PbS in turn influence its photosensitivity.

The chemical deposition of PbS produced a good nanocrystalline structure with the crystal size of less than 1 μm and provided good photosensitivity and transport properties. These characteristics can be used as necessary conditions for PV.

Examples

The PbS thin films were grown on glass slide (22 mm×22 cm×1 mm) substrates. Prior to deposition, the substrates were cleaned to remove organic containments from their surfaces, using RCA-1 clean. Glass slides were placed in boiling solution of 1:1:5 (27% $H_2O_2$):(30% $NH_4OH$):$H_2O$ for 15 minutes, rinsed with deionized water, and dried before use. The experimental setup consisted simply of a 50 mL beaker. Lead acetate [$Pb(C_2H_3O_2)_2$], with concentration range of 0.01-0.3 M, was mixed with potassium chloride [KOH], within a the range of 0.15-0.9 M concentration. To this mixture thiourea [$SC(NH_2)_2$], concentration range of 0.033-0.4 M, and sodium sulfite [$Na_2SO_3$], molarity range of 0.071-0.119 M, was added. The pH was measured using Cole Parmer pH 500 Series meter and was kept at approximately at 12.9. The total volume of the solution was 20 mL. It was found that the formation of PbS film is strongly affected by the initial nucleation at the glass substrate. A seeding procedure was devised in order to enhance the initial nucleation. In one case, 1 mL of 1.0 M KOH was added to 5 mL of 0.2 M lead acetate in beaker A; in beaker B, 3 mL of 0.8 M thiourea was created. The glass substrate was then dipped into beaker A and transferred to beaker B. The substrate was then introduced horizontally in the 20 mL deposition solution for about 50 minutes to deposit a layer of PbS film.

In experiments in which successive PbS layers were to be deposited on the same substrate, after the deposition of the first layer, the film was washed in deionized water to remove any lose particles, dried and introduced in a new bath. When the deposition process was completed, the PbS film from the top layer was removed by wiping with a cotton swab immersed in 1:3 $HCl$:$H_2O$ solution. The thickness of a film was then determined using interference spectroscopy according to the following equation, $d=(m \cdot \lambda_1)/(4 \cdot n)$, where m is an integer number starting from one and corresponding to the order of extremum, including maxima and minima, n is the refractive index and meaning of $\lambda_1$ and $\lambda_2$ is demonstrated in FIG. 5. The order of extremum, m, is found from the wavelengths of two adjacent extrema in the spectral region where n does not change appreciably when m is increased by one, $$m = \frac{\lambda_2}{\lambda_1 - \lambda_2}.$$

FIG. 5 shows the transmission and reflection spectra of a 547 nm sample, measured using Cary 5E spectrometer. In this case, m was equal to 4 and n was taken at 4.2.

After determining the thickness of a sample, the substrate was diced into 5×5 mm$^2$ squares and ohmic contacts were added with silver paint. Hall mobility, resistivity, and carrier concentration were measured using an Ecopia HMS-3000 hall measurement system. The responsivity at 25° C. was determined using an IR-508 (Infrared Systems, Sandcove, Conn.) cavity blackbody at 400° C. The radiation beam was modulated with an IR-301 black body source controller. The chopping frequency was selected to be 500 Hz. The a.c. photoconductive signal was a taken from a matched load resistance and measured using a SR510 lock-in amplifier, and the circuit was biased at 20 VDC.

The radiance of the blackbody is 0.08 W cm$^{-2}$π$^{-1}$sr$^{-1}$, when the upper limit of the wavelength response of the detector is 3 μm [18]. The diameter of the hole in front of the blackbody is 0.13 inches, and the distance between the detector and radiator is 15 cm, thus the solid angle is:

$$\Omega = \frac{\pi \times (.13 \text{ in})^2}{(15 \text{ cm})^2} \text{ sr} = 3.81 \times 10^{-4} \text{ sr}.$$

The visible area of the detector is 3×5 mm², so the radiant power at the detector is:

$$\phi_c^s = \frac{(3.81 \times 10^{-4} \text{ sr} \times (3 \times 5 \text{ mm}^2) \times 0.08)}{\pi} \text{W cm}^{-2}\text{sr}^{-1} = 1.45 \times 10^{-6} \text{ W}.$$

For a voltage response at the detector of 0.8 mV this gives a responsivity of:

$$R_v = \frac{0.8 \text{ mV}}{1.45 \times 10^{-6} \text{ W}} = 550 \frac{\text{V}}{\text{W}}.$$

The cell time constant was determined by increasing the chopping frequency and noting the −3 dB point, Fads. The −3 dB roll-off frequency was then converted to time constant value using the following relationship:

$$\tau = \frac{1}{2\pi F_{3dB}}.$$

Importance of Seeding

It has been determined that the formation of PbS film is affected by the initial nucleation at the glass substrate. A seeding procedure was devised in which the Teflon stand holding the glass substrate was briefly dipped in solution of KOH and lead acetate, and finally thiourea, before being transferred to the 20 mL deposition solution. Table I, lists the results of two different seed solutions.

On the first glance, (or intuitively) one can expect that the concentration of charge carriers in deposited films has to be dependent on concentration of key components in a reagent mixture. This is because of general opinion that carrier concentration in lead salt semiconductors depends on excess of vacancies of one of components Pb or S. For example, in the compound semiconductor PbS each Pb vacancy gives rise to one positive carrier (hole) and each S vacancy produces one free electron. Vacancies of Pb behave like acceptors and produce excess of holes; vacancies of S behave like donors and give electron type of conductivity with electron concentration higher than intrinsic concentration. The number of vacancies depends on concentration of components in a reagent mixture and their deviation from stoicheometry.

Table I

| Sample # | pH | Thickness in nm | $R_v$ in V/W | Concentration $cm^{-3}$ | Mobility $cm^2/(v \cdot sec)$ | $\Omega \cdot cm$ | Molarity |
|---|---|---|---|---|---|---|---|
| 1 | 12.89 | 595 | 895 | $2.7 \times 10^{16}$ | 14.1 | 17.9 | In 20 mL solution: 0.05M Pb acetate 0.2M thiourea 0.119M $Na_2SO_3$ 0.52M KOH Seed solution: 0.183M lead acetate 0.172M KOH 0.8M thiourea |
| 2 | 13.02 | 490 | 616 | $4.3 \times 10^{16}$ | 9.5 | 15.3 | Same as sample 1 |
| 3 | 12.97 | 559 | 963 | $3.23 \times 10^{16}$ (+36% lead acetate seed) | 18 | 10.8 | In 20 Ml solution: 0.05M Pb acetate 0.2M thiourea 0.119M $Na_2SO_3$ 0.52M KOH Seed solution: 0.25M lead acetate 0.172M KOH 0.8M thiourea |
| 4 | 13.04 | 585 | 323 | $5.4 \times 10^{16}$ (+36% lead acetate seed) | 6.8 | 17.7 | Same as sample 3 |

Samples 1 and 2 used the same deposition and seed solution; however, sample 1 was slightly patchy to one corner in addition to having different characteristics. For sample 1, the Teflon stand holding the glass substrate was held vertically and shaken three times after the last dip in thiourea, while when preparing sample 2, the excess solution was wiped at the edge of the beaker after each dip. Samples 3 and 4 also used the same deposition and seed solution; however the excess solution in sample 3 was shaken of while sample 4 was wiped. In this case, sample 3 was slightly patchy in the middle of the substrate and again the two samples have dissimilar characteristics. The inconsistency in seeding was attributed to the difference in results.

Stoichiometric Deposition Tendency

One of the goals of the experiments was to chemically vary the carrier concentration of the deposited lead salt films. It is shown in Table II that despite a 25% increase in the three main components (lead acetate, thiourea and sodium sulfite) the carrier concentration does not change by orders of magnitude.

TABLE II

Film characteristics and variation of concentrations in the 20 mL deposition solution

| Sample # | pH | Thickness in nm | $R_v$ in V/W | Concentration cm$^{-3}$ | Mobility cm$^2$/(v · sec) | $\Omega \cdot$ cm | Molarity |
|---|---|---|---|---|---|---|---|
| 5 | 12.86 | 400 | 172 | $6.9 \times 10^{16}$ | 3.34 | 26.92 | In 20 mL solution: 0.033M lead acetate 0.133M thiourea 0.079M Na2SO3 0.35M KOH Seed solution: 0.111M lead acetate 0.114.M KOH 0.53M thiourea |
| 6 | 12.85 | 480 | 516 | $7.5 \times 10^{16}$ (+25% thiourea) | 7.96 | 10.72 | In 20 mL solution: 0.033M Pb acetate 0.166M thiourea 0.079M Na2SO3 0.35M KOH Seed solution: Same as sample 5 |
| 7 | 12.83 | 387 | 309 | $3.9 \times 10^{16}$ (+25% lead acetate) | 6.38 | 24.98 | In 20 mL solution: 0.041M lead acetate 0.166M thiourea 0.079M Na2SO3 0.35M KOH Seed solution: Same as sample 5 |
| 8 | 12.77 | 447 | 486 | $2.6 \times 10^{16}$ (+25% Na$_2$SO$_3$) | 6.4 | 37.95 | In 20 mL solution: 0.041M lead acetate 0.166M thiourea 0.099M Na2SO3 0.35M KOH Seed solution: Same as sample 5 |

It is shown that the films were deposited with a certain concentration regardless of the molarity of reagents in the mixture. Seeding probably had a bigger effect on the carrier concentrations. The amount of lead acetate and thiourea in solution does however affect the induction time or the time needed for Pb$^{2+}$ and S$^{2+}$ ions to exceed solubility product of PbS. The induction time is marked by blackening of solution which signals the precipitation of insoluble particles of PbS. A higher lead acetate and thiourea concentration reduced the induction time and increased the thickness of the deposited film to an extent. This can be explained by the fact that layer deposition and bulk precipitation occur in the solution at the same time. A reagent concentration favoring layer formation rather than bulk precipitation is preferred, and the thickness of a layer also depends on the proper seeding. In Table III, samples 9 and 10 had induction times of ~6-7 minutes, while sample 11 had an induction time of ~38 minutes.

TABLE III

Film characteristics of solutions with different concentrations

| Sample # | pH | Thickness in nm | $R_v$ in V/W | Concentration cm$^{-3}$ | Mobility cm$^2$/(v · sec) | $\Omega \cdot$ cm | Molarity |
|---|---|---|---|---|---|---|---|
| 9 | 13.05 | 4.57 | 36 | $1.1 \times 10^{18}$ | 3.9 | 2.1 | In 20 mL solution: 0.3M lead acetate 0.2M thiourea 0.119M Na$_2$SO$_3$ 0.9M KOH Seed solution: 0.4M lead acetate 1.2M KOH 0.8M thiourea |
| 10 | 12.91 | 479 | 550 | $1.2 \times 10^{17}$ | 6.9 | 7.8 | In 20 mL solution: 0.05M lead acetate 0.2M thiourea 0.119M Na$_2$SO$_3$ 0.52M KOH Seed solution: |

TABLE III-continued

Film characteristics of solutions with different concentrations

| Sample # | pH | Thickness in nm | $R_v$ in V/W | Concentration cm$^{-3}$ | Mobility cm$^2$/(v·sec) | Ω·cm | Molarity |
|---|---|---|---|---|---|---|---|
| 11 | 13.08 | 279 | 75 | $1.7 \times 10^{18}$ | 1.7 | 2.1 | 0.166M lead acetate<br>0.172M KOH<br>0.8M thiourea<br>In 20 mL solution:<br>0.05M lead acetate<br>0.025M thiourea<br>0.119M Na$_2$SO$_3$<br>0.45M KOH<br>Seed solution:<br>0.066M lead acetate<br>0.6M KOH<br>0.14M thiourea |

Sample 9, with much higher solution concentrations, immediately precipitates the majority of its reagents upon mixture, while in sample 10 the amount of precipitate was reduced. In sample 11 there was hardly any precipitate at the bottom of the beaker, however the concentrations were so low that the induction time was significantly increased.

Range of Characteristics

Regardless of the difficulties with consistent seeding, the electrical properties of the deposited layers could be chemically varied. Table IV lists three different samples with varied seeding and solution molarities. The carrier concentrations were varied from $10^{16}$ to $10^{18}$ cm$^{-3}$ and other properties related to the carrier concentration tracked this change.

TABLE IV

Chemical variation of electrical characteristics

| Sample # | pH | Thickness in nm | $R_v$ in V/W | Concentration cm$^{-3}$ | Mobility cm$^2$/(v·sec) | Ω·cm | Molarity |
|---|---|---|---|---|---|---|---|
| 12 | 12.85 | 219 | none | $4.9 \times 10^{18}$ | 3.4 | 0.3 | In 20 mL solution:<br>0.025M lead acetate<br>M thiourea<br>0.059M Na$_2$SO$_3$<br>0.26M KOH<br>Seed solution:<br>0.083M Pb acetate<br>0.147M KOH<br>0.4M thiourea |
| 13 | 12.91 | 479 | 550 | $1.2 \times 10^{17}$ | 6.9 | 7.8 | In 20 mL solution:<br>0.05M lead acetate<br>M thiourea<br>0.119M Na$_2$SO$_3$<br>0.52M KOH<br>Seed solution:<br>0.166M Pb acetate<br>0.172M KOH<br>0.8M thiourea. |
| 14 | 12.89 | 595 | 895 | $2.7 \times 10^{16}$ | 14.1 | 17.9 | In 20 mL solution:<br>0.05M lead acetate<br>M thiourea<br>0.119M Na$_2$SO$_3$<br>0.52M KOH<br>Seed solution:<br>0.183M Pb acetate<br>0.172M KOH<br>0.8M thiourea |

Mobility Versus Deposition Layer

The deposition of multiple layers was described earlier, and it involved washing the first layer in DI (deionized water) water to remove any lose particles, drying the film and introducing the substrate into a new bath. Several experiments with multilayer deposition were conducted and table V represents the results.

TABLE V

Characteristics of multiple deposited layers.

| Sample # | pH | Thickness in nm | $R_v$ in V/W | Concentration $cm^{-3}$ | Mobility $cm2/(v \cdot sec)$ | $\Omega \cdot cm$ | Molarity |
|---|---|---|---|---|---|---|---|
| 15 | 12.86 | 400 | 172 | $6.9 \times 10^{16}$ | 3.34 | 26.92 | In 20 mL solution: |
|  | 12.8 | 1500 | 344 | $6.6 \times 10^{16}$ | 4.7 | 20.4 | 0.033M Pb acetate |
|  | 12.77 | 2307 | 89 | $7.4 \times 10^{16}$ | 15.4 | 5.6 | 0.133M thiourea |
|  |  |  |  |  |  |  | 0.079M $Na_2SO_3$ |
|  |  |  |  |  |  |  | 0.35M KOH |
|  |  |  |  |  |  |  | Seed solution: |
|  |  |  |  |  |  |  | 0.111M lead acetate |
|  |  |  |  |  |  |  | 0.114M KOH |
|  |  |  |  |  |  |  | 0.53M thiourea |

As can be seen the mobility slowly increases with additional layer deposition, however the carrier concentration remains relatively constant throughout. The resistivity also decreases with additional layer deposition. One possible reason for better film equality with additional depositions can be better crystal quality in the upper layers. As can be seem from FIG. 6, the first layer is disoriented, but by the third layer cubic crystals of about 200 nm wide are visible. This example also demonstrates that it is possible to deposit relatively thick films with only three depositions.

SUMMARY OF RESULTS

In the examples, the chemical bath deposition technique was used to deposit PbS thin films layers of varying thicknesses. It was found that the formation of PbS film is affected by the initial nucleation at the glass substrate, and that proper seeding can control both electrical and physical properties of the deposited films. Irrespective of the difficulties with consistent seeding, the electrical properties of the deposited layers were chemically varied, and multi layer films were created. The results also indicate that the upper layers of deposition have better crystal quality.

Although the present invention has been fully described in conjunction with several embodiments thereof with reference to the accompanying drawings, it is to be understood that various changes and modifications may be apparent to those skilled in the art. Such changes and modifications are to be understood as included within the scope of the present invention as described by the appended claims, unless they depart there from.

BROAD SCOPE OF THE INVENTION

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure, the following abbreviated terminology may be employed: "e.g." which means "for example."

What is claimed is:

1. A method comprising:
   fabricating a photovoltaic structure constructed to absorb solar spectrum photons and produce of electrical energy, said photovoltaic structure comprising:
   a light transmitting substrate layer;
   a transparent electrode layer on said substrate layer;
   a wide band gap, nanocrystalline or microcrystalline, thin film semiconductor layer with a mobility of carrier that is greater than 1 cm2v-1s-1, formed on said transparent electrode;
   a narrow-band-gap, direct band gap second semiconductor layer, with a mobility of carriers that is greater than 10 cm2v-1s-1, which creates a hetero-structure boundary between itself and said wide-band-gap layer on which it is formed; said direct band gap second semiconductor layer formed by chemical bath deposition of a chalcogenide thin film on said wide band gap layer;

a second electrode layer on said direct band gap semiconductor layer; and a protective layer deposited on said second electrode layer.

2. The method of claim 1, wherein:

said photovoltaic structure comprises a layer of a lead chalcogenide.

3. The method of claim 2, wherein:

said lead chalcogenide layer is an average of 0.4 to 1.2 μm thick.

4. The method of claim 2, wherein:

said chalcogenide is a nanocrystalline lead chalcogenide.

5. The method of claim 4, wherein:

said lead chalcogenide is a member of a group comprising nanocrystalline lead sulfide, nanocrystalline lead selenide, and nanocrystalline lead telluride.

6. The method of claim 1, wherein:

said wide band gap layer comprises a material selected from a group comprising micro-crystalline silicon, nano-crystalline Si, and cadmium selenide; and said narrow-band-gap layer comprises a nano-crystalline layer of a lead chalcogenide salts selected from a group comprising PbS, PbSe, and PbTe.

7. The method of claim 1, wherein:

a thickness of said photovoltaic structure, including electrodes and protecting layers, but without said substrate layer is less than 5 um.

8. The method of claim 1, wherein:

said photovoltaic structure further comprises ohmic contacts with said first electrode and said second electrode.

9. The method of claim 1, wherein:

said transparent electrode layer comprises a transparent indium tin oxide layer and said second electrode layer comprises platinum or gold.

10. The method of claim 1, wherein:

said protective layer comprises a chalcogenide glass material.

11. The method of claim 1, wherein:

said protective layer comprises a thin film of $Al_2O_3$, $As_2Se_3$, $As_2Se_3$, CdTe, $MgF_2$, $SiO_2$, SiO, polystyrene, ethylcellulose, nitrocellulose, polyvinylchloride, ABS, polymethylmethacrylate, polybutadiene, or polyvinylalcohol.

12. The method of claim 1, wherein:

said second electrode has a work function equal to or greater than a work function of said narrow-band-gap layer; and said narrow-band-gap layer comprises nanocrystalline lead chalcogenide salts semiconductor layer selected from a group comprising PbS, PbSe, and PbTe.

13. The method of claim 1, wherein:

said second electrode comprises at least one of silver, copper, molybdenum, rhenium, selenium, tantalum, beryllium, rhodium, silicon, cobalt, iron, palladium, ruthenium, tellurium, gold, carbon, chromium, iridium, platinum, antimony, tungsten and nickel.

14. The method of claim 1, wherein:

said second electrode comprises at least one of gold or platinum.

15. The method of claim 1, wherein:

said wide band gap layer has an average thickness of 0.5 to 2 microns.

16. The method of claim 1, wherein:

said chalcogenide thin film comprises a lead chalcogenide salt having a nanocrystalline structure with a crystal size of less than 1 micron.

17. The method of claim 1, wherein:

said chemical bath deposition comprises activities comprising:

depositing one lead chalcogenide layer on said substrate;

washing said lead chalcogenide layer with deionized water thereby removing loose particles;

drying said washed lead chalcogenide layer; and depositing a subsequent lead chalcogenide layer to increase a thickness and modify properties of said narrow-band-gap layer.

18. The method of claim 1, wherein:

a plurality of said layers are added to said photovoltaic structure via chemical bath deposition comprising activities comprising:

depositing one layer on said substrate;

washing said one layer with deionized water thereby removing loose particles;

drying said washed one layer; and depositing a subsequent layer to increase a thickness and modify properties of said photovoltaic structure.

19. The method of claim 1, wherein:

said lead chalcogenide has crystals with an average dimension of about 200 nm and carrier mobility above 10 cm2v-1s-1.

20. The method of claim 1, wherein:

said transparent electrode has a transmittance above 80% and sheet resistance less than 70 ohm/sq cm.

\* \* \* \* \*